United States Patent
Chuang et al.

(10) Patent No.: US 7,334,979 B2
(45) Date of Patent: Feb. 26, 2008

(54) ADJUSTABLE SUBSTRATE TRANSFER APPARATUS

(75) Inventors: Cheng Doul Chuang, Miao-Li (TW); Chien-Sung Deng, Miao-Li (TW); Hung-Wen Yang, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 440 days.

(21) Appl. No.: 10/997,228

(22) Filed: Nov. 24, 2004

(65) Prior Publication Data
US 2005/0220581 A1    Oct. 6, 2005

(30) Foreign Application Priority Data
Dec. 31, 2003    (TW) .............................. 92137548 A

(51) Int. Cl.
*B65H 39/02*    (2006.01)
(52) U.S. Cl. .................. 414/331.16; 414/404; 414/937
(58) Field of Classification Search ................ 414/404, 414/405, 787, 810, 806, 331.16, 937, 331.01; 156/654
See application file for complete search history.

(56) References Cited

U.S. PATENT DOCUMENTS

| | | | | |
|---|---|---|---|---|
| 3,943,635 A * | 3/1976 | Ito | ............................... | 33/264 |
| 4,261,079 A * | 4/1981 | Masini et al. | ............. | 19/159 R |
| 4,597,819 A * | 7/1986 | Kusuhara et al. | ...... | 156/345.54 |
| 4,857,406 A * | 8/1989 | Schwab et al. | ......... | 428/402.22 |
| 5,211,296 A * | 5/1993 | D'Heygere | .................. | 211/187 |
| 5,423,503 A * | 6/1995 | Tanaka et al. | ........... | 248/277.1 |
| 5,735,662 A * | 4/1998 | Nichols et al. | ......... | 414/331.16 |
| 5,759,007 A * | 6/1998 | Nichols et al. | ......... | 414/416.04 |
| 6,074,154 A | 6/2000 | Ueda et al. | | |
| 6,543,982 B1 * | 4/2003 | Nichols et al. | ......... | 414/331.16 |
| 7,114,908 B1 * | 10/2006 | Sarver et al. | ............. | 414/790.2 |
| 2002/0098067 A1 * | 7/2002 | De Luna et al. | ............ | 414/404 |
| 2003/0123963 A1 * | 7/2003 | Farrell et al. | ............... | 414/404 |

* cited by examiner

*Primary Examiner*—Charles A Fox
(74) *Attorney, Agent, or Firm*—Wei Te Chung

(57) ABSTRACT

A substrate transfer apparatus (100) includes a base (40), first and second cassettes (1, 2), a adjustable cassette (6), and a push unit (50). The adjustable cassette (6) is between the first and second cassettes, and has a pair of side walls (640), a top wall (630) interconnecting the side walls, and a height-adjusting mechanism (63). The base supports the first and second cassettes and the adjustable cassette thereon, and defines a central slide groove (41) therein. The push unit includes a slide portion (550) and an urging portion (500). The slide portion can slide in the central slide groove. The height-adjusting mechanism can adjust a height of the adjustable cassette according to the height of the first cassette and the height of second cassette. The urging portion can push substrates in the first cassette into the adjustable cassette and further into the second cassette.

11 Claims, 3 Drawing Sheets

ADJUSTABLE SUBSTRATE TRANSFER APPARATUS

BACKGROUND OF THE INVENTION

1. Field of the Invention

The present invention relates to a substrate transfer apparatus for transferring substrates such as LCD (Liquid Crystal Display) panels, and particularly to a substrate transfer apparatus used to transfer substrates in batches.

2. Description of the Prior Art

Nowadays, various kinds of substrates including glass substrates are extensively used for LCDs, plasma displays and hybrid ICs (Integrated Circuits). In an LCD factory, in general, the substrates are loaded into a substrate cassette for storage or transportation. The cassette can conveniently hold a plurality of the substrates. This kind of means is in widespread use for carrying substrates between fabrication stations in the factory or between factories.

However, it is rather troublesome to transfer the substrates between different cassettes. This is because the substrates are generally transferred one by one, either by hand or through a servo manipulator. The substrates are easily scraped or damaged in this process; for example, an operator may accidentally bump a substrate while carrying it. In addition, the inefficiency of the process is significant when a large number of substrates need be transferred.

Therefore, it is desired to provide a substrate transfer apparatus which overcomes the above-described disadvantages by transferring the substrates safely in batches.

SUMMARY OF THE INVENTION

An object of the present invention is to provide a substrate transfer apparatus for transferring a plurality of substrates in batches, and with minimal risk of damage to the substrates.

In order to achieve the above-described object, a substrate transfer apparatus in accordance with the present invention comprises a base, a first cassette, a second cassette, a adjustable cassette, and a push unit. The first cassette and the second cassette are for containing and transporting substrates. The adjustable cassette is located between the first and second cassettes, and has a pair of opposite side walls, a top wall interconnecting the side walls, and a height-adjusting mechanism. The base supports the first and second cassettes and the adjustable cassette thereon, and defines a slide groove therein. The push unit includes a slide portion and an urging portion. The slide portion can slide in the central slide groove. The height-adjusting mechanism can adjust a height of the adjustable cassette according to the height of the first cassette and the height of second cassette. The urging portion can slide between the side walls of the first cassette, and push substrates in the first cassette into the adjustable cassette and further into the second cassette.

Other objects, advantages, and novel features of the present invention will be apparent from the following detailed description of a preferred embodiment thereof with reference to the attached drawings, in which:

DETAILED DESCRIPTION OF THE PRESENT INVENTION

Figure 1:
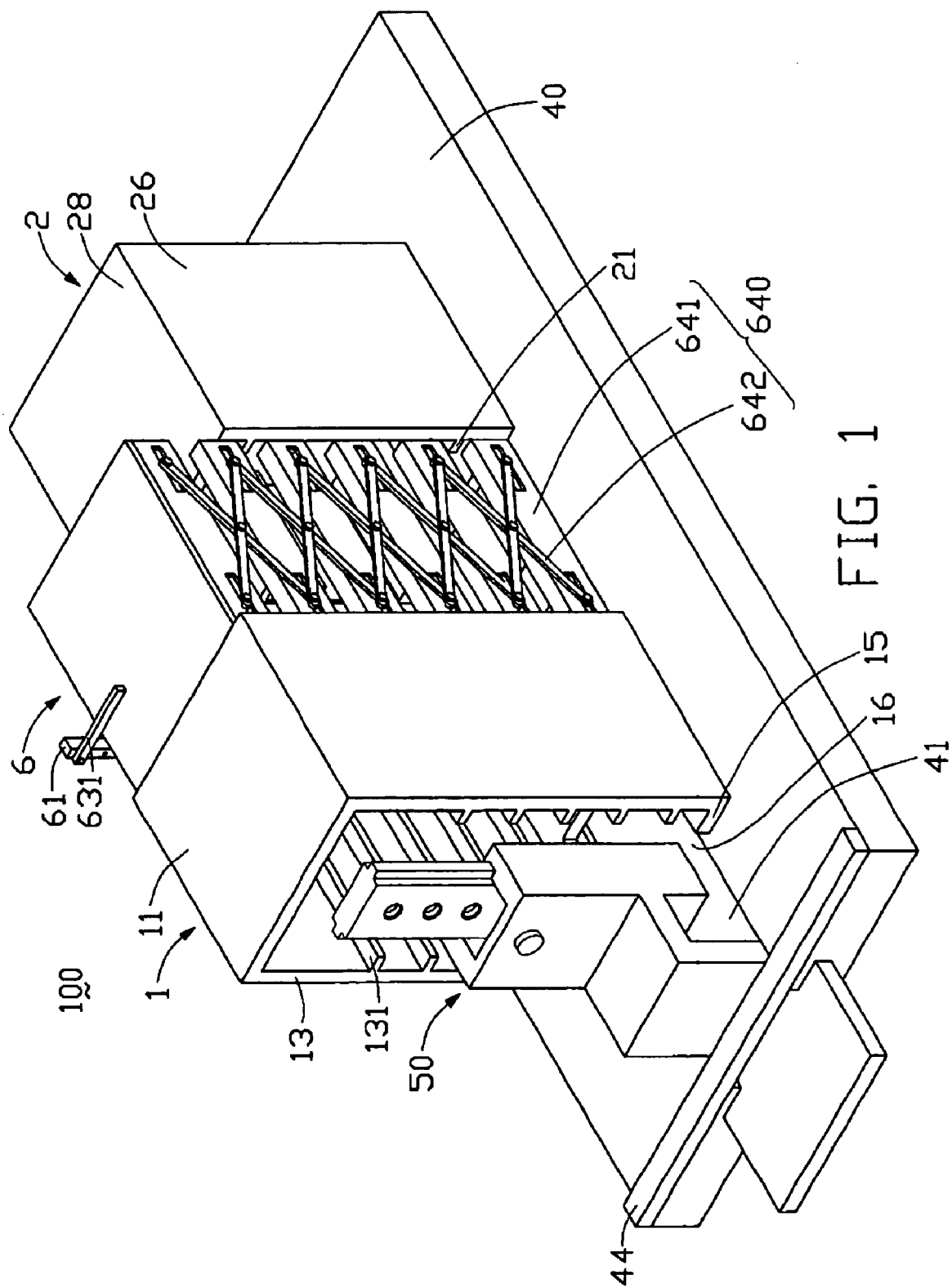
FIG. 1 is an isometric view of a substrate transfer apparatus according to the present invention, the substrate transfer apparatus comprising a first cassette, a second cassette, a adjustable cassette and a push unit.
Figure 2:
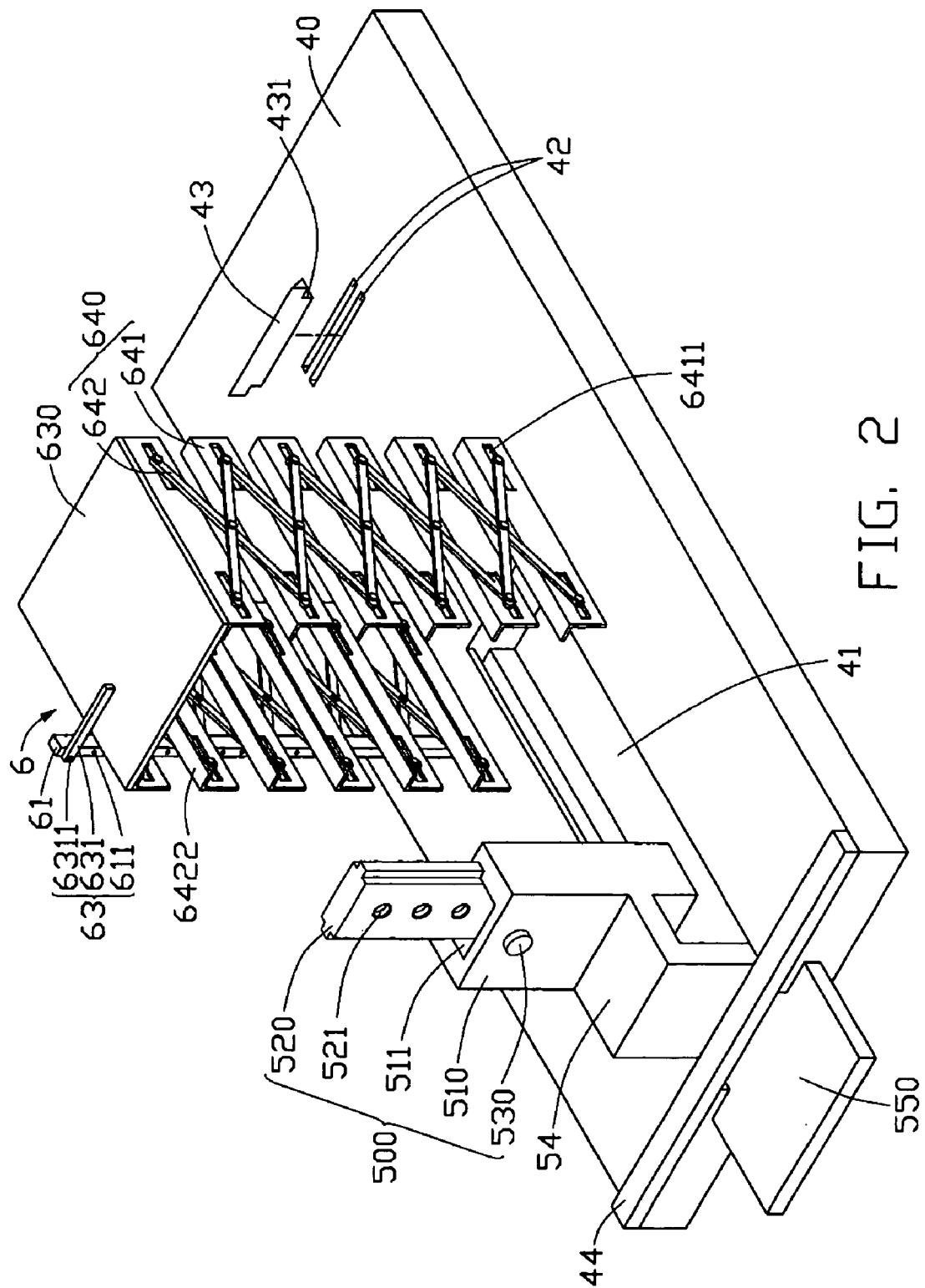
FIG. 2 is similar to FIG. 1, but with the first and the second cassettes removed.
Figure 3:
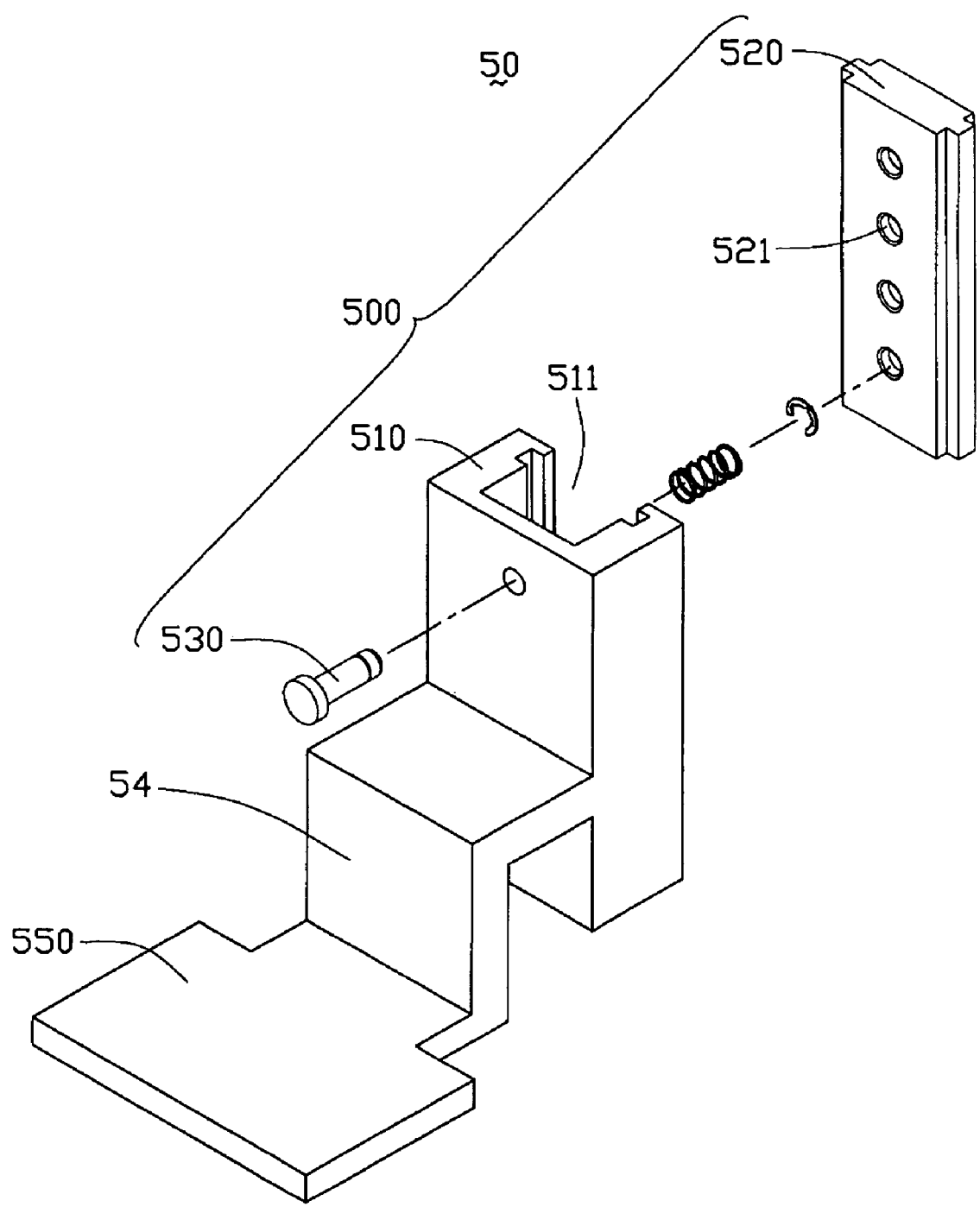
FIG. 3 is an enlarged, exploded view of the push unit of FIG. 1.

Referring to FIGS. 1, 2 and 3, a substrate transfer apparatus 100 comprises a base 40, a first cassette 1, a second cassette 2, a adjustable cassette 6, and a push unit 50. The first and second cassettes 1, 2 are for containing and transporting substrates such as LCD panels.

The first cassette 1 includes a pair of opposite side walls 13, a top wall 11 interconnecting the side walls 13, and a pair of bottom flanges 15 extending inwardly from bottom ends (not labeled) of the side walls 13 respectively. The bottom flanges 15 define a space 16 therebetween. The side walls 13 include a plurality of supporting members 131 extending inwardly therefrom, for supporting substrates (not shown) accommodated in the first cassette 1.

The second cassette 2 includes a pair of opposite side walls 26, and a top wall 28 interconnecting the side walls 26. The side walls 26 include a plurality of supporting members 21 extending inwardly therefrom, for supporting the substrates when they are accommodated in the second cassette 2.

The adjustable cassette 6 comprises a pair of opposite side walls 640, a top wall 630 interconnecting the side walls 640, and a height-adjusting mechanism 63. The adjustable cassette 6 has an inverted 'U' shape, and is located between the first and second cassettes 1 and 3. Each of the side walls 640 of the adjustable cassette 6 comprises a plurality of side plates 641 and a plurality of concertina rods 642. Each side plate 641 has a supporting member 6422 extending inwardly therefrom, and defines two aligned sliding slots 6411 therein. The concertina rods 642 are pivotably attached to each other in zigzag fashion, such that they cooperatively provide an expandable and collapsible frame. The concertina rods 642 are movably connected to the side plates 641 at the sliding slots 6411.

The height-adjusting mechanism 63 comprises a vertical post 61 with a scale marked thereon, and a adjustable beam 631 adjustably connected to the post 61. Several positioning holes 611 are defined along the length of the post 61. The adjustable beam 631 can be selectably positioned at a desired positioning hole 611 by a bolt 6311. The post 61 is fixed on the base 40. A main portion of the adjustable beam 631 is fixed on the top wall 630 of the adjustable cassette 6. When the adjustable beam 631 is changed from one positioning hole 611 to a lower positioning hole 611, it moves the top wall 630 down in unison. This causes the concertina rods 642 to collapse, and a height of the adjustable cassette 6 to be reduced. Similarly, when the adjustable beam 631 is changed from one positioning hole 611 to a higher positioning hole 611, the height of the adjustable cassette 6 is increased.

The base 40 supports the first cassette 1, the second cassette 2 and the adjustable cassette 6 thereon. A central longitudinal slide groove 41 is defined in approximately an end half portion of the base 40 that corresponds to the first cassette 1. The central slide groove 41 defines a generally T-shaped profile. A width of the central slide groove 41 is substantially the same as a width of the space 16 of the first cassette 1. A pair of transverse latch slots 42 is defined at an end of the base 40 distal from the central slide groove 41. A stop tab 43 with a bottom locating latch 431 is also provided. The locating latch 431 can be engaged in a selected one of the latch slots 42.

The push unit 50 includes a slide portion 550, and an urging portion 500 connected to the slide portion 550. The slide portion 550 can slide in the central slide groove 41 of the base 40. The urging portion 500 can slide between the side walls 13 of the first cassette 1, so as to push substrates in the first cassette 1 into the adjustable cassette 6 and further into the second cassette 2. The push unit 50 further includes a connection portion 54. The connection portion 54 includes a vertical board (not labeled) connecting with the slide portion 550, and a horizontal board (not labeled) connecting with the urging portion 500.

The urging portion 500 comprises a vertical holder 510 and a positioning mechanism (not labeled). The holder 510 defines a central slide groove 511. The positioning mechanism comprises a vertical slider 520, a bolt 530, and several positioning holes 521 defined along a length of the slider 520. The slider 520 can slide along the slide groove 511, and can be positioned therein by way of the bolt 530 being engaged in a selected positioning hole 521. With these structures, the height of the urging portion 500 can be adjusted by the positioning mechanism. Thus the urging portion 500 can push all the substrates in one of the cassettes 1, 6 to another of the cassettes 6, 2 without bumping the top walls 11, 630.

The substrate transfer apparatus 100 is made of material that can resist electrostatic discharge. Further, the substrate transfer apparatus 100 may optionally further comprise a stop bar 44 at an end thereof corresponding to the first cassette 1.

In assembly and preparation for use of the substrate transfer apparatus 100, the substrates to be transferred are placed on the supporting members 131 of the first cassette 1. The first cassette 1, the adjustable cassette 6 and the second cassette 2 are placed closely in a row on the base 40. The adjustable cassette 6 is disposed between the first cassette 1 and the second cassette 2. The locating latch 431 of the stop tab 43 is fixed in a selected one of the latch slots 42, thereby locating and fastening the second cassette 2 on the base 40. The slide portion 550 of the push unit 50 is slidably received in the central slide groove 41 of the base 40, with the slider 520 positioned above the bottom flanges 15 of the first cassette 1 and below the top wall 11. The push unit 50 is thus movably assembled with the base 40 and the first cassette 1. The stop bar 44 is transversely fastened to the base 40 above the slide portion 550, so as to prevent the slide portion 550 from sliding completely out from the central slide groove 41.

In operation, the push unit 50 is pushed toward the adjustable cassette 6, with the slide portion 550 sliding in the central slide groove 41. The urging portion 500 thus pushes the substrates in the first cassette 1 into the adjustable cassette 6 in a single batch. If a size of the first cassette 1 is the same as a size of the second cassette 2, the substrates in the adjustable cassette 6 can be continued to be pushed into the second cassette 2 by the push unit 50. If the size of the first cassette 1 is different from that of the second cassette 2, the height of the adjustable cassette 6 is adjusted by operating the height-adjusting mechanism 63, so that the adjustable cassette 6 corresponds to the size of the second cassette 2. The height of the slider 520 is adjusted by operating the positioning mechanism, so that the urging portion 500 corresponds to the height of the second cassette 2. After these adjustments, the substrates in the adjustable cassette 6 are pushed into the second cassette 2 by the push unit 50 in a single batch.

The main advantage of the substrate transfer apparatus 100 is that the substrates in the first cassette 1 are transferred to the second cassette 2 in a single batch, rather than one by one. When the size of the first cassette 1 is different from the size of the second cassette 2, the height of the adjustable cassette 6 can be adjusted accordingly. This enables quick and smooth transfer of the substrates, with little risk of the substrates sustaining scraping or damage. In addition, the efficiency of the transfer process is particularly high when a large number of substrates need to be transferred.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A substrate transfer apparatus comprising:
   a first cassette for containing substrates therein;
   a second cassette for containing substrates therein;
   an adjustable cassette between the first and second cassettes, the adjustable cassette having a pair of side walls, a top wall, and a height-adjusting mechanism, a post and a adjustable beam movably connected to the post, a portion of the adjustable beam being fixed on the top wall of the adjustable cassette;
   a base supporting the first and second cassettes and the adjustable cassette thereon, and defining a slide groove therein, the post being fixed on the base; and
   a push unit comprising a slide portion, and an urging portion connected to the slide portion;
   wherein the slide portion can slide in the slide groove, the height-adjusting mechanism can adjust a height of the adjustable cassette according to the height of the first cassette and the height of the second cassette, and the urging portion can push substrates in the first cassette into the adjustable cassette and further into the second cassette, each of the side walls of the adjustable cassette comprises a plurality of side plates and concertina rods, the side plates each have a supporting member extending inwardly therefrom and two sliding slots defined therein, each concertina rod comprises two rods pivotally connected together, and the concertina rods are movably connected to the side plates at the sliding slots.

2. The substrate transfer apparatus as claimed in claim 1, wherein the urging portion comprises a holder and a positioning mechanism, the holder defines a slide groove, the positioning mechanism comprises a bolt, a slider, and a plurality of positioning holes defined along a length of the slider, and the slider can slide along the slide groove and be positioned therein by engagement of the bolt in a selected one of the positioning holes.

3. The substrate transfer apparatus as claimed in claim 2, wherein the adjustable cassette has an inverted 'U' shape.

4. The substrate transfer apparatus as claimed in claim 2, wherein the base has a stop tab attached on an end thereof, for locating and fastening the second cassette on the base.

5. The substrate transfer apparatus as claimed in claim 4, wherein the base further defines at least one latch slot in said end thereof, the stop tab has a locating latch, and the locating latch can be engaged in said latch slot for locating and fastening the second cassette.

6. The substrate transfer apparatus as claimed in claim 2, further comprising a stop bar transversely fastened to the base above the slide groove, for preventing the slide portion from sliding completely out from the slide groove.

7. The substrate transfer apparatus as claimed in claim 2, wherein the push unit further comprises a connection portion interconnecting the slide portion and the urging portion.

8. The substrate transfer apparatus as claimed in claim 7, wherein the connection portion includes a vertical part connecting with the slide portion, and a horizontal part connecting with the urging portion.

9. The substrate transfer apparatus as claimed in claim 2, wherein the slide groove defines a generally T-shaped profile.

10. The substrate transfer apparatus as claimed in claim 2, wherein the first cassette comprises a pair of bottom flanges extending inwardly from bottom ends of the side walls respectively, the bottom flanges define a space therebetween, and a width of the space is substantially the same as a width of the slide groove.

11. The substrate transfer apparatus as claimed in claim 2, wherein the substrate transfer apparatus is made of material that can resist electrostatic discharge.

* * * * *